United States Patent
Dejima

(10) Patent No.: US 10,991,730 B2
(45) Date of Patent: Apr. 27, 2021

(54) ACTIVE MATRIX SUBSTRATE

(71) Applicant: Sharp Kabushiki Kaisha, Sakai (JP)

(72) Inventor: Yoshio Dejima, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 41 days.

(21) Appl. No.: 16/525,688

(22) Filed: Jul. 30, 2019

(65) Prior Publication Data

US 2020/0043956 A1    Feb. 6, 2020

Related U.S. Application Data

(60) Provisional application No. 62/712,268, filed on Jul. 31, 2018.

(51) Int. Cl.
*H01L 27/12* (2006.01)
*G02F 1/1362* (2006.01)
(Continued)

(52) U.S. Cl.
CPC ........ *H01L 27/1248* (2013.01); *G02F 1/1345* (2013.01); *G02F 1/133345* (2013.01); *G02F 1/136286* (2013.01); *H01L 27/124* (2013.01); *G02F 1/1368* (2013.01); *G02F 1/13685* (2021.01); *G02F 1/133357* (2021.01)

(58) Field of Classification Search
CPC ............... H01L 27/1248; H01L 27/124; H01L 27/3276; H01L 27/3291; H01L 27/3223; G02F 1/133345; G02F 1/136286; G02F 1/1345; G02F 1/133357; G09G 2300/0421; G09G 2300/0426

See application file for complete search history.

(56) References Cited

U.S. PATENT DOCUMENTS

2014/0347590 A1   11/2014  Fujita et al.
2016/0253030 A1   9/2016   Tada et al.

FOREIGN PATENT DOCUMENTS

WO    2013/105537 A1    7/2013
WO    2015/059995 A1    4/2015

*Primary Examiner* — Kenneth Parker
*Assistant Examiner* — John Lin
(74) *Attorney, Agent, or Firm* — Keating & Bennett, LLP

(57) ABSTRACT

An active matrix substrate includes, in a peripheral region that is disposed around a display region, a connecting portion formation region in which a plurality of line connecting portions are arranged. Each line connecting portion includes: a lower connecting portion; an organic insulating layer disposed on the lower connecting portion so as to be in contact with the lower connecting portion, the organic insulating layer having at least one aperture through which a part of the lower connecting portion is exposed; and an upper connecting portion disposed on the organic insulating layer and in the at least one aperture, the upper connecting portion being directly in contact with the part of the lower connecting portion within the at least one aperture. The organic insulating layer extends into an adjoining region that adjoins the connecting portion formation region. In the adjoining region, the organic insulating layer has a plurality of dummy apertures that are disposed so as not to overlap the lower connecting portions when viewed from the normal direction of the substrate, each dummy aperture exposing a part of an underlying layer that is located on the substrate side of the lower connecting portion. The upper connecting portions are not provided in the plurality of dummy apertures.

12 Claims, 10 Drawing Sheets

(51) Int. Cl.
 *G02F 1/1333* (2006.01)
 *G02F 1/1345* (2006.01)
 *G02F 1/1368* (2006.01)

ACTIVE MATRIX SUBSTRATE

BACKGROUND

1. Technical Field

The present invention relates to an active matrix substrate.

2. Description of the Related Art

Display devices that include an active matrix substrate having a switching element provided for each pixel are widely in use. An active matrix substrate that includes thin film transistors (hereinafter, "TFTs") as switching elements is referred to as a TFT substrate. In the present specification, portions of a TFT substrate that would correspond to pixels of a display device may also be referred to as pixels. In the place of an amorphous silicon or a polycrystalline silicon, an oxide semiconductor is also proposed as the material of an active layer of a TFT.

In a peripheral region (i.e., a region other than the display region) of an active matrix substrate, a connecting portion (hereinafter a "line connecting portion") for connecting (or reconnecting) two electrically conductive layers which are disposed via an interlayer insulating layer is provided. In the line connecting portion, for example, the electrically conductive layer (upper conductive layer) above the interlayer insulating layer and the electrically conductive layer (lower conductive layer) below the interlayer insulating layer are connected to each other within an aperture that is made in the interlayer insulating layer (see International Publication No. 2013/105537, for example).

SUMMARY

In an active matrix substrate, a planarization layer, such as an organic insulating film, may be used as an interlayer insulating layer. In this case, at a line connecting portion, an upper conductive layer and a lower conductive layer may be connected to each other within an aperture that is made in the organic insulating film, for example.

However, according to a study by the inventors, such a line connecting portion may suffer from a problem in that the organic insulating film may become detached at the aperture edge (hereinafter, this will be referred to as "film detachment"). Details thereof will be described later.

If an organic insulating film experiences detachment at a line connecting portion, insufficiencies such as connection insufficiencies, generation of dust due to delamination of the organic insulating film, etc., may occur, possibly lowering the production yield or reliability of the active matrix substrate.

An embodiment of the present invention has been made in view of the above problem, and aims to suppress connection insufficiencies at a line connecting portion of an active matrix substrate, thereby enhancing reliability of the active matrix substrate.

The present specification discloses active matrix substrates as recited in the following Items.

[Item 1]

An active matrix substrate comprising: a display region that includes a plurality of pixels; and a peripheral region that is disposed around the display region, the peripheral region including a connecting portion formation region in which a plurality of line connecting portions are arranged, wherein, each of the plurality of line connecting portions includes a lower connecting portion supported on a substrate, an organic insulating layer disposed on the lower connecting portion so as to be in contact with the lower connecting portion, the organic insulating layer having at least one aperture through which a part of the lower connecting portion is exposed, and an upper connecting portion disposed on the organic insulating layer and in the at least one aperture, the upper connecting portion being directly in contact with the part of the lower connecting portion within the at least one aperture;

the organic insulating layer extends into an adjoining region that adjoins the connecting portion formation region;

in the adjoining region, the organic insulating layer has a plurality of dummy apertures that are disposed so as not to overlap the lower connecting portions when viewed from a normal direction of the substrate, each of the plurality of dummy apertures exposing a part of an underlying layer that is located on the substrate side of the lower connecting portion; and the upper connecting portions are not provided in the plurality of dummy apertures.

[Item 2]

The active matrix substrate of Item 1, wherein a subset of the plurality of dummy apertures is disposed on the display region side of the connecting portion formation region, and another subset of the plurality of dummy apertures is disposed on an opposite side of the connecting portion formation region from the display region.

[Item 3]

The active matrix substrate of Item 1 or 2, wherein the plurality of dummy apertures are spaced apart from one another, so as to surround the connecting portion formation region.

[Item 4]

The active matrix substrate of any of Items 1 to 3, further comprising an inorganic insulating layer that covers the organic insulating layer and the upper connecting portions in the connecting portion formation region and the adjoining region, wherein, the inorganic insulating layer is directly in contact with the part of the underlying layer in each of the plurality of dummy apertures.

[Item 5]

The active matrix substrate of any of Items 1 to 4, wherein, when viewed from the normal direction of the substrate, the at least one aperture in the organic insulating layer of each of the plurality of line connecting portions includes a first aperture subregion and a second aperture subregion, and a third aperture subregion connecting between the first aperture subregion and the second aperture subregion, wherein a maximum width of the third aperture subregion taken along an orthogonal direction which is orthogonal to a direction that the third aperture subregion extends between the first aperture subregion and the second aperture subregion is smaller than a maximum width of the first aperture subregion and smaller than a maximum width of the second aperture subregion as taken along the orthogonal direction.

[Item 6]

The active matrix substrate of any of Items 1 to 5, further comprising a plurality of lower wiring lines extending along a first direction and a plurality of upper wiring lines extending along the first direction, wherein, the plurality of line connecting portions are arranged along a second direction which is orthogonal to the first direction;

each upper connecting portion is connected to a corresponding one of the plurality of upper wiring lines; and each lower connecting portion is connected to a corresponding one of the plurality of lower wiring lines.

[Item 7]

The active matrix substrate of Item 6, wherein, the plurality of lower wiring lines are arranged along the second direction with interspaces existing between one another;

the plurality of upper wiring lines are arranged along the second direction with interspaces existing between one another; and a subset of the plurality of dummy apertures is disposed in the interspaces between the plurality of lower wiring lines, and another subset of the plurality of dummy apertures is disposed in the interspaces between the plurality of upper wiring lines.

[Item 8]

An active matrix substrate comprising: a display region that includes a plurality of pixels; and a peripheral region that is disposed around the display region, the peripheral region including a connecting portion formation region in which a plurality of line connecting portions are arranged, wherein, each of the plurality of line connecting portions includes a lower connecting portion supported on a substrate, an organic insulating layer disposed on the lower connecting portion so as to be in contact with the lower connecting portion, the organic insulating layer having at least one aperture through which a part of the lower connecting portion is exposed, and an upper connecting portion disposed on the organic insulating layer and in the at least one aperture, the upper connecting portion being directly in contact with the part of the lower connecting portion within the at least one aperture; and, when viewed from the normal direction of the substrate, the at least one aperture includes a first aperture subregion and a second aperture subregion, and a third aperture subregion connecting between the first aperture subregion and the second aperture subregion, wherein a maximum width of the third aperture subregion taken along an orthogonal direction which is orthogonal to a direction that the third aperture subregion extends between the first aperture subregion and the second aperture subregion is smaller than a maximum width of the first aperture subregion and smaller than a maximum width of the second aperture subregion as taken along the orthogonal direction.

[Item 9]

The active matrix substrate of Item 8, wherein the maximum width of the first aperture subregion as taken along the orthogonal direction is smaller than the maximum width of the second aperture subregion as taken along the orthogonal direction.

[Item 10]

The active matrix substrate of Item 8 or 9, wherein, when viewed from the normal direction of the substrate, a peripheral edge of the third aperture subregion comprises a curve.

[Item 11]

The active matrix substrate of any of Items 8 to 10, further comprising a plurality of lower wiring lines extending along a first direction and a plurality of upper wiring lines extending along the first direction, wherein, the plurality of line connecting portions are arranged along a second direction which is orthogonal to the first direction;

each upper connecting portion is connected to a corresponding one of the plurality of upper wiring lines; and each lower connecting portion is connected to a corresponding one of the plurality of lower wiring lines.

[Item 12]

The active matrix substrate of Item 11, wherein the first aperture subregion and the second aperture subregion are arranged along the first direction with the third aperture subregion interposed therebetween.

[Item 13]

The active matrix substrate of any of Items 1 to 12, wherein, in the connecting portion formation region, the at least one aperture in the organic insulating layers of the plurality of line connecting portions are arranged in a staggered manner.

[Item 14]

An active matrix substrate comprising: a display region that includes a plurality of pixels; and a peripheral region that is disposed around the display region, the peripheral region including a connecting portion formation region in which a plurality of line connecting portions are arranged, wherein, each of the plurality of line connecting portions includes a lower connecting portion supported on a substrate, an organic insulating layer disposed on the lower connecting portion so as to be in contact with the lower connecting portion, the organic insulating layer having at least one aperture through which a part of the lower connecting portion is exposed, and an upper connecting portion disposed on the organic insulating layer and in the at least one aperture, the upper connecting portion being directly in contact with the part of the lower connecting portion within the at least one aperture; and, in the connecting portion formation region, the at least one aperture in the organic insulating layers of the plurality of line connecting portions are arranged in a staggered manner.

[Item 15]

The active matrix substrate of Item 14, wherein, in the connecting portion formation region, the upper connecting portions and/or the lower connecting portions are arranged in a staggered manner.

[Item 16]

The active matrix substrate of Item 14 or 15, further comprising a plurality of lower wiring lines extending along a first direction and a plurality of upper wiring lines extending along the first direction, wherein, the plurality of line connecting portions are arranged, in a row or in a staggered manner, along a second direction which is orthogonal to the first direction;

each upper connecting portion is connected to a corresponding one of the plurality of upper wiring lines; and each lower connecting portion is connected to a corresponding one of the plurality of lower wiring lines.

[Item 17]

The active matrix substrate of any of Items 1 to 16, wherein, when viewed from the normal direction of the substrate, a peripheral edge of the at least one aperture in the organic insulating layer of each of the plurality of line connecting portions consists of a curve or curves.

[Item 18]

The active matrix substrate of any of Items 6, 7, 11, 12, and 16, wherein the at least one aperture in the organic insulating layer of each of the plurality of line connecting portions comprises a plurality of apertures that are arranged along the first direction.

[Item 19]

The active matrix substrate of any of Items 6, 7, 11, 12, 16, and 18, wherein, the active matrix substrate further comprises a common electrode disposed in the display region, and an auxiliary metal line that is in contact with the common electrode;

the plurality of lower wiring lines are a plurality of source bus lines; and the plurality of upper wiring lines and the upper connecting portions are made of a same metal film as the auxiliary metal line.

[Item 20]

The active matrix substrate of any of Items 6, 7, 11, 12, 16, and 18, wherein, the active matrix substrate further comprises a driving line for driving an in-cell touch screen panel, the driving line being disposed in the display region;

the plurality of lower wiring lines are a plurality of source bus lines; and the plurality of upper wiring lines and the upper connecting portions are made of a same metal film as the driving line.

According to an embodiment of the present invention, it is possible to suppress connection insufficiencies at a line connecting portion of an active matrix substrate, thereby enhancing reliability of the active matrix substrate.

DETAILED DESCRIPTION

As described above, the inventors have found that, in a line connecting portion which is provided in a peripheral region of an active matrix substrate, an organic insulating film may experience detachment.

Hereinafter, the problem of film detachment will be described by taking as an example a connecting portion (hereinafter "source line connecting portion") for connecting (or reconnecting) a source bus line and an upper wiring line that is disposed on the source bus line via an interlayer insulating layer.

Figure 12A:
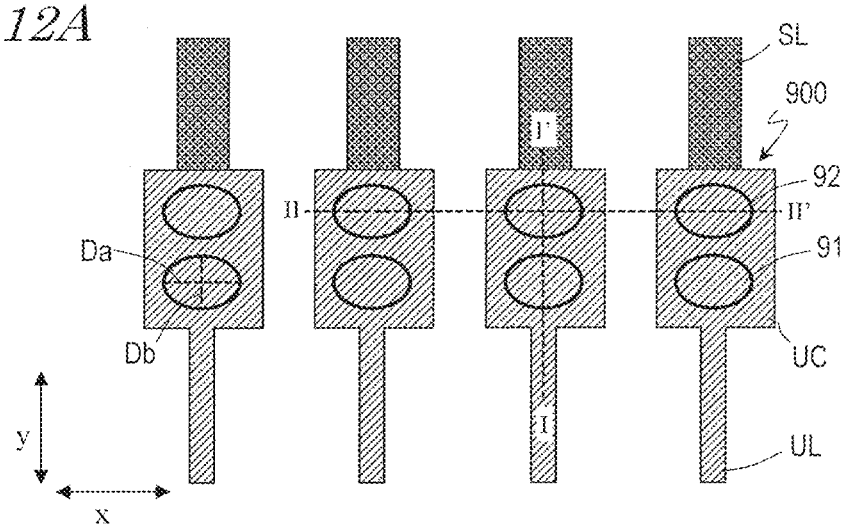
FIG. 12A is a plan view illustrating a source line connecting portion 900 according to Reference Example.
Figure 12B:
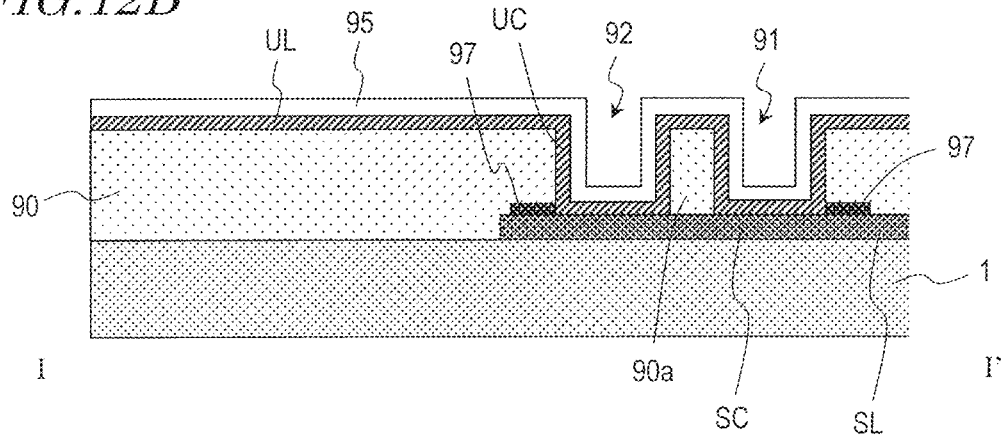
FIG. 12B is a cross-sectional view of the source line connecting portion 900 as taken along line I-I'.
Figure 12C:
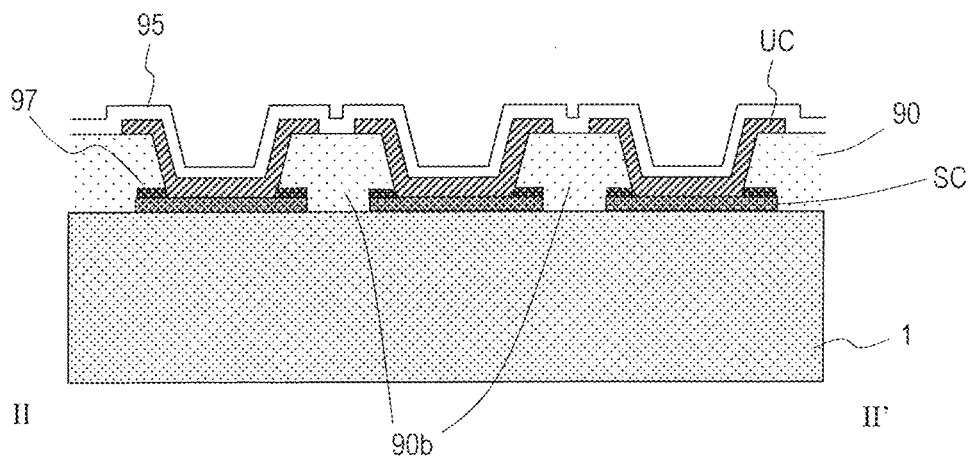
FIG. 12C is a cross-sectional view of the source line connecting portion 900 as taken along line II-II'.

FIG. 12A is a plan view illustrating a source line connecting portion 900 according to Reference Example. FIGS. 12B and 12C are cross-sectional views of the source line connecting portion 900 as taken along line I-I' and taken along line II-II', respectively.

In a peripheral region of the active matrix substrate, the following are provided: a plurality of source bus lines SL which extend from a display region that includes a plurality of pixels; a plurality of upper wiring lines UL that are formed in an upper layer relative to the source bus lines SL; and a plurality of source line connecting portions 900. Each source bus line SL and each upper wiring line UL extend along a first direction y. The plurality of source bus lines SL, the plurality of upper wiring lines UL, and the plurality of source line connecting portions 900 are arranged along a second direction x that intersects the first direction y, for example. Each source bus line SL is connected to one of the plurality of upper wiring lines UL via a corresponding source line connecting portion 900.

The source line connecting portion 900 includes: a source connecting portion SC, which is a part of the source bus line SL; and an upper connecting portion UC, which is a part of the upper wiring line UL that is disposed on the source connecting portion SC via an organic insulating layer 90. The organic insulating layer 90 has apertures 91 and 92 through which the source connecting portion SC is partially exposed. In this example, when viewed from the normal direction of the substrate, the apertures 91 and 92 each have an elliptical shape with a major axis Da which is parallel to the second direction x and a minor axis Db which is parallel to the first direction y. The upper connecting portion UC is in contact with the source connecting portion SC in the apertures 91 and 92. The upper connecting portion UC and the upper wiring line UL may be covered by an insulating film 95. In Reference Example, one source line connecting portion 900 has two apertures 91 and 92. Forming a redundant structure with two or more apertures can provide enhanced reliability.

According to a study by the present inventors, the source line connecting portion 900 of Reference Example may experience film detachment 97 of the organic insulating layer 90.

Figure 13A:
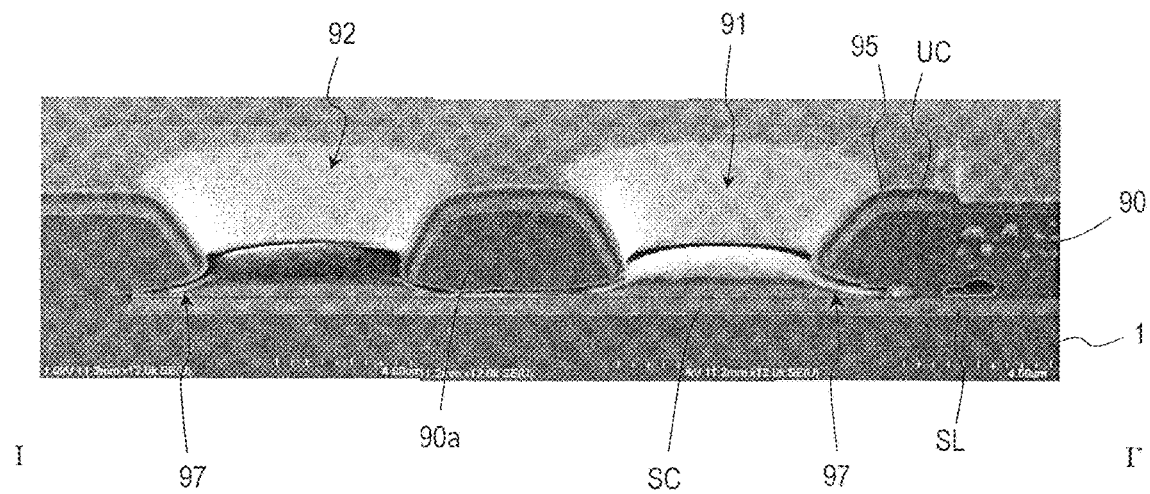
FIG. 13A is a SEM image of a cross section of the source line connecting portion 900 taken along line I-I'.
Figure 13B:
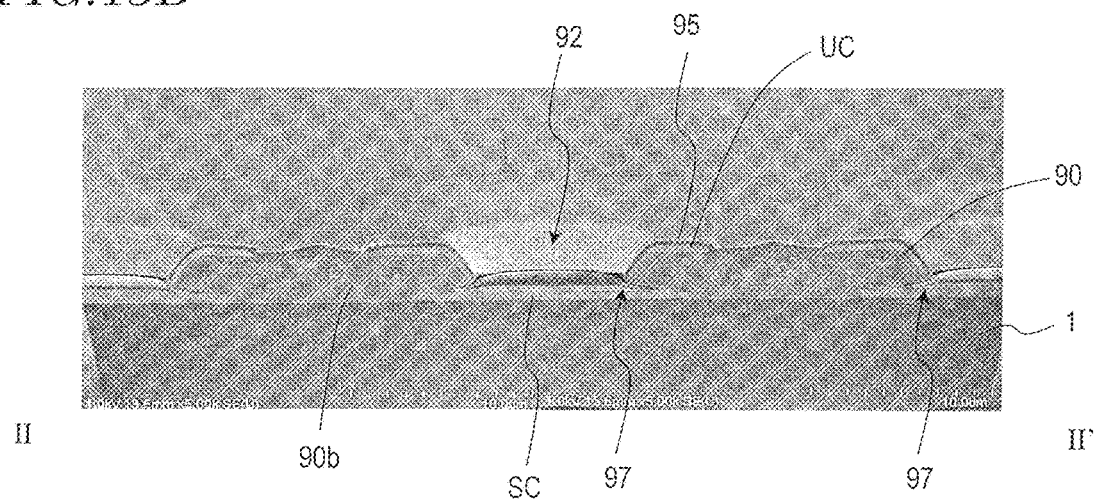
FIG. 13B is a SEM image of a cross section of the source line connecting portion 900 taken along line II-II'.

FIG. 13A is a SEM image of a cross section (i.e., a cross section taken across the centers of the apertures 91 and 92 along the first direction y (minor axis direction)) of the source line connecting portion 900 taken along line I-I'. FIG. 13B is a SEM image of a cross section (i.e., a cross section taken across the center of the aperture 92 along the second direction x (longitudinal direction)) of the source line connecting portion 900 taken along line II-II'.

It can be seen from FIGS. 13A and 13B that the film detachment 97 is in progress, at the edge (side wall portion) of the apertures 91 and 92 in the organic insulating layer 90, where the organic insulating layer 90 is becoming detached from the surface of the source connecting portion SC.

Generally speaking, the organic insulating layer 90 is formed by, after applying an organic material on the substrate to form a coating film, baking it through a heat treatment. During the heat treatment, contraction of the coating film occurs. Contraction of the coating film introduces a stress to the organic insulating layer 90. Particularly in the case where the organic insulating layer 90 is to function as a planarization film, etc., the organic insulating layer 90 will be made thick (thickness: e.g., about 2 μm to 5 μm), thus leading to greater stresses associated with contraction. It is presumable that, since the apertures 91 and 92 of the organic insulating layer 90 potentially act as buffering regions for the stresses associated with contraction, a substantial tension acts on the interface between the edge of the aperture 91 or 92 in the organic insulating layer 90 and the source connecting portion SC, thus causing the film detachment 97 as illustrated.

It can be seen from the results shown in FIGS. 13A and 13B that, film detachment 97 is more likely to occur in a cross section of the aperture 91 or 92 along its minor axis direction, than in a cross section along its longitudinal direction. This is presumably because, in portions of the edge of the apertures 91 and 92 where the curvature is relatively large, the tension acting on the interface between the organic insulating layer 90 and the source connecting portion SC is more relaxed or dispersed than in portions where the curvature is small (i.e., closer to being a straight line), so that film detachment 97 is suppressed.

It can also be seen that, in a cross section (FIG. 13A) of the aperture 91 or 92 along its minor axis direction, film detachment is more likely to occur at an edge (outside) of the aperture 91 which is opposite to the edge (inside) that is closer to the aperture 92; similarly, film detachment is more likely to occur at the outside edge of the aperture 92. In other words, film detachment does not occur (or is reduced as compared to any other portion) in a portion 90a of the organic insulating layer 90 that is located between the two apertures 91 and 92. It is presumable from this that in a region of the organic insulating layer 90 that is interposed (or surrounded) by a plurality of apertures, the stress associated with contraction of the organic insulating layer 90 is reduced, thus making film detachment less likely to occur. However, in a cross section of the aperture 92 along its longitudinal direction (FIG. 13B), film detachment is also observed in a portion 90b of the organic insulating layer 90 that is located between two adjacent apertures 92. Possible reasons thereof are that: the width of the portion 90b of the organic insulating layer 90 (i.e., distance between the apertures 92) being greater than the width of the portion 90a located between the apertures 91 and 92 (i.e., distance between the aperture 91 and the aperture 92) results in a greater contraction stress being inflicted on the portion 90b of the organic insulating layer 90; the effects of stress relaxation based on interposition between apertures 92 cannot be adequately obtained because the portion 90b of the organic insulating layer 90 is not sufficiently surrounded by the apertures 92; and so on.

Thus, problems of film detachment abound in regions where relatively small apertures are densely arranged, e.g., a connecting portion formation region or a terminal portion formation region in a peripheral region of an active matrix substrate.

Based on the above findings which have been obtained through various studies, the present inventors have sought for a structure that allows stresses associated with contraction of the organic insulating layer 90 to be relaxed or counteracted, thereby arriving at the present invention.

First Embodiment

Hereinafter, with reference to the drawings, an active matrix substrate according to a first embodiment will be described. Although an active matrix substrate for use in a liquid crystal display device will be exemplified as the active matrix substrate, active matrix substrates according to embodiments of the present invention may encompass an active matrix substrate of any other transmission-type display device, e.g., electrophoresis display devices, MEMS (Micro Electro Mechanical System) display devices, organic EL (Electroluminescence) display devices.

The active matrix substrate according to the present embodiment includes at least one line connecting portion that electrically connects between two electrically conductive layers, this being provided on a substrate. The line connecting portion may be a connecting portion that allows wiring lines to be reconnected, or may be a terminal portion.

Figure 1:
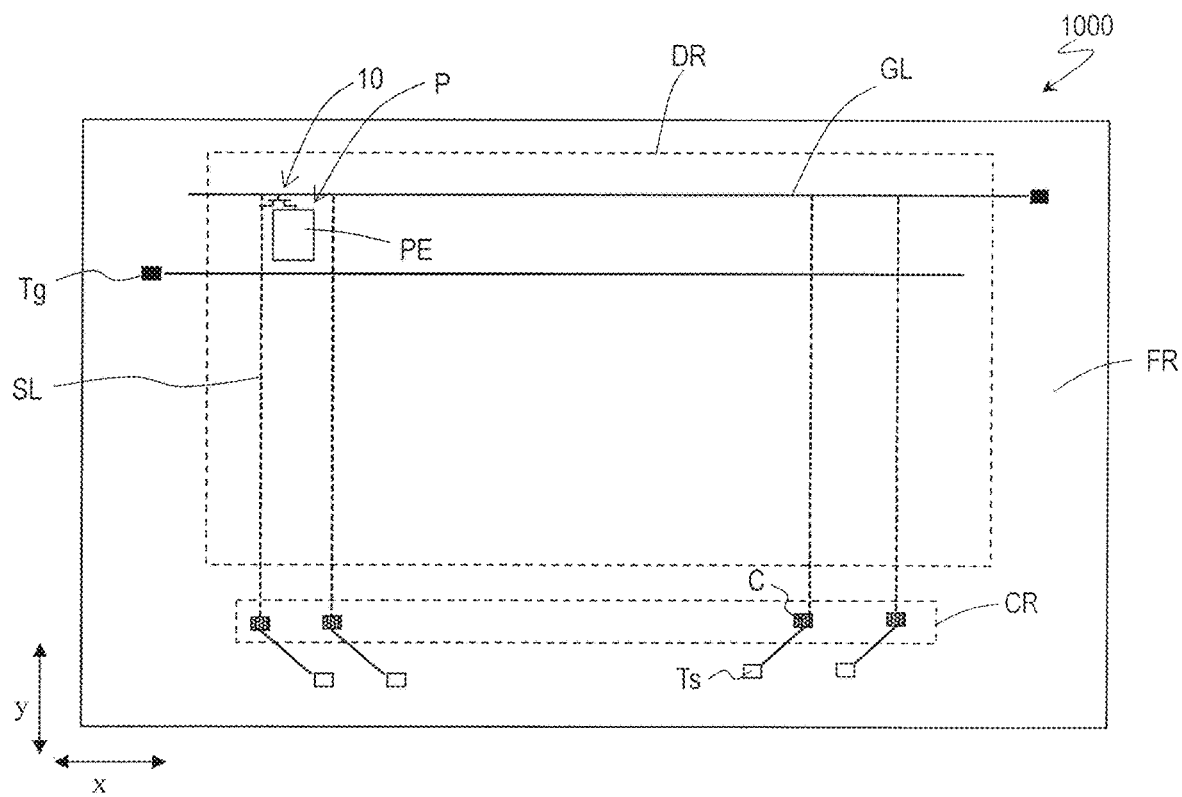
FIG. 1 is a schematic illustration showing an exemplary planar structure of an active matrix substrate 1000 according to a first embodiment.

FIG. 1 is a schematic illustration showing an exemplary planar structure of an active matrix substrate 1000 according to the present embodiment.

The active matrix substrate 1000 includes a display region DR which contributes to display, and a peripheral region (frame region) FR that is located outside the display region DR.

In the display region DR, a plurality of source bus lines (data lines) SL extending along a first direction y and a plurality of gate bus lines (gate lines) GL extending along a second direction x which intersects (e.g., being orthogonal to in this example) the first direction y are provided. Each region that is surrounded by these bus lines defines a "pixel region P". The pixel regions P are regions corresponding to pixels of a display device, and therefore may also be referred to as "pixels". The plurality of pixel regions P are arranged in a matrix shape. In each pixel region P, a pixel electrode PE and a thin film transistor (TFT) 10 are formed. A gate electrode of each TFT 10 is electrically connected to a corresponding gate bus line GL, while a source electrode of each TFT 10 is electrically connected to a corresponding source bus line SL. Moreover, a drain electrode of each TFT 10 is electrically connected to the pixel electrode PE. In the present embodiment, a common electrode (not shown) opposing the pixel electrode PE is provided above the pixel electrode PE, via a dielectric layer (insulating layer).

In the peripheral region FR, terminal portions such as a plurality of gate terminal portions Tg and a plurality of source terminal portions Ts, and line connecting portions such as a plurality of source line connecting portions C are disposed. Each gate bus line GL is connected to a gate driver (not shown) via a corresponding gate terminal portion Tg. Each source bus line SL is connected to a source driver (not shown) via a corresponding source terminal portion Ts. The gate driver(s) and the source driver(s) may be monolithically formed on the active matrix substrate 100, or mounted on the active matrix substrate 1000.

Each source line connecting portion C is a junction between: a source bus line SL or any wiring line that is made of the same electrically conductive layer (source metal layer) as the source bus line SL; and an upper wiring line UL that is formed in an electrically conductive layer that constitutes an upper layer relative to the source bus line SL, for example. The upper wiring line UL may be connected to the source driver via the source terminal portion Ts. The upper wiring line UL may be a metal line layer.

The plurality of source line connecting portions C may be arranged with a pitch which is substantially equal to or smaller than the array pitch of the source bus lines SL.

As shown in the figure, the plurality of source line connecting portions C may be arranged along the second direction x, between a source terminal portion formation region in which the source terminal portions Ts are formed and the display region DR, for example. In the present specification, a region CR in which the plurality of source line connecting portions C are arranged will be referred to as the "connecting portion formation region".

<Pixel Region P>

Figure 2:
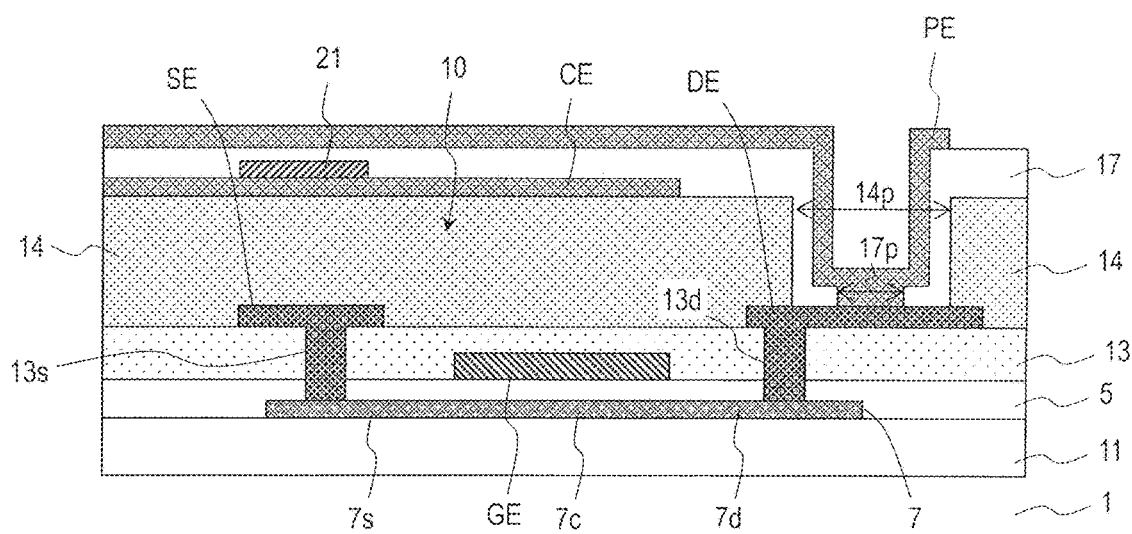
FIG. 2 is a cross-sectional view illustrating an example of each pixel region P of the active matrix substrate 1000.

FIG. 2 is a cross-sectional view illustrating an example of each pixel region P of an active matrix substrate 1000.

The pixel region P includes a substrate 1, a TFT 10 supported on the substrate 1, a pixel electrode PE, and a common electrode CE. The common electrode CE and the pixel electrode PE are transparent electrodes that are made of a transparent electrically conductive film. In this example, the pixel electrode PE is disposed on the common electrode CE via an insulating layer (dielectric layer) 17.

The TFT 10 may be a top-gate type crystalline silicon TFT, for example. The TFT 10 includes: a crystalline silicon semiconductor layer (e.g., a low-temperature polysilicon layer) 7 disposed on the substrate 1; a gate insulating layer 5 covering the crystalline silicon semiconductor layer 7; a gate electrode GE disposed on the crystalline silicon semiconductor layer 7 via the gate insulating layer 5; an insulating layer (e.g., inorganic insulating layer) 13 covering the gate electrode GE; and a source electrode SE and a drain electrode DE. An underlying film 11 may be formed between the crystalline silicon semiconductor layer 7 and the substrate 1.

The crystalline silicon semiconductor layer 7 includes a region (active region) 7c in which a channel is formed, and a source region 7s and a drain region 7d respectively located on both sides of the active region. In this example, the portion of the crystalline silicon semiconductor layer 7 that overlaps the gate electrode GE via the gate insulating layer 5 defines the active region 7c.

The source electrode SE and the drain electrode DE are disposed on the insulating layer 13 and in apertures 13s and 13d, respectively, which are made in the insulating layer 13 and the gate insulating layer 5, such that the source electrode SE and the drain electrode DE are electrically connected to the source region 7s and the drain region 7d within the apertures 13s and 13d, respectively.

The gate electrode GE is electrically connected to a corresponding gate bus line GL (FIG. 1), whereas the source electrode SE is electrically connected to a corresponding source bus line SL (FIG. 1). The drain electrode DE is electrically connected to the pixel electrode PE.

The TFT 10 is covered by an organic insulating layer 14. The organic insulating layer 14 may be directly in contact with upper faces of the source electrode SE and the drain electrode DE. The organic insulating layer 14 functions as a planarization layer.

On the organic insulating layer 14, the pixel electrode PE and the common electrode CE are disposed. Regarding the pixel electrode PE and the common electrode CE partially overlapping each other via the dielectric layer 17, whichever one of the pixel electrode PE and the common electrode CE is upper in location has one or more slits (aperture(s)) or a recess(s) made in each pixel region P.

Separate pixel electrodes PE exist for the respective pixels. The common electrode CE may not be separated for each pixel. For example, the common electrode CE may be formed across the entire pixel region P, except for the region (TFT formation region) in which the TFTs 10 are formed.

In this example, the pixel electrode PE is disposed above the common electrode CE (i.e., on the opposite side from the substrate 1). That is, the common electrode CE is disposed between the pixel electrode PE and the organic insulating layer 14. Within a pixel contact hole that is made in the dielectric layer 17 and the organic insulating layer 14, the pixel electrode PE is in contact with the drain electrode DE. The pixel contact hole is formed as a result of an aperture 17p in the dielectric layer 17 and an aperture 14p in the organic insulating layer 14 at least partially overlapping each other.

Although not shown, the common electrode CE may be disposed above the pixel electrode PE. That is, the pixel electrode PE may be disposed between the organic insulating layer 14 and the common electrode CE. In this case, the pixel contact hole may only be an aperture in the organic insulating layer 14. The pixel electrode PE may be in contact with the drain electrode DE within an aperture (pixel contact hole) in the organic insulating layer 14.

A metal line 21 having a smaller electrical resistance than that of the common electrode CE may be provided so as to be directly in contact with the common electrode CE. The metal line 21 and the common electrode CE are electrically connected with a common line that is provided in the peripheral region FR. In this example, the metal line 21 functions as an auxiliary wiring line (auxiliary metal line) for the common electrode CE. The metal line 21 may be in contact with an upper face or a lower face of the common electrode CE. When viewed from the normal direction of the substrate 1, the metal line 21 may extend so as to overlap the source bus line SL (i.e., along the first direction y). As a result, without lowering the pixel aperture ratio, the electrical resistance of the common electrode CE and the metal line 21 as taken together can be made smaller than the electrical resistance of the common electrode CE alone. As a result, variation among voltages to be applied via the common electrode CE to the liquid crystal layer of the respective pixels in the panel plane can be reduced.

In the present specification, a layer that is made of the same electrically conductive film (first electrically conductive film) as the gate bus lines GL is referred to as the "gate metal layer" or the "first metal layer"; a layer that is made of the same electrically conductive film (second electrically conductive film) as the source bus lines SL is referred to as the "source metal layer" or the "second metal layer"; a layer that is made of the same transparent electrically conductive film (first transparent electrically conductive film) as the common electrode CE is referred to as the "first transparent electrically conductive layer"; and a layer that is made of the same transparent electrically conductive film (second transparent electrically conductive film) as the pixel electrodes PE is referred to as the "second transparent electrically conductive layer". Moreover, a layer (metal layer) that is formed of a metal film in an upper layer relative to the organic insulating layer 14 (i.e., opposite from the substrate 1) is referred to as the "third metal layer". In this example, the metal line 21 is formed in the third metal layer. Alternatively, although not shown, wiring lines for driving a touch screen panel may be formed in the third metal layer.

The gate electrode GE and the gate bus line GL may be integrally formed within the gate metal layer (by using the first electrically conductive film). The gate electrode GE may be a part within the gate bus line GL, or be a protrusion from the gate bus line GL.

The source electrode SE, the drain electrode DE, and the source bus line SL may be formed in with the source metal layer. The source electrode SE and the source bus line SL may be integrally formed within the source metal layer (by using the second electrically conductive film). The source electrode SE may be a part within the source bus line SL, or be a protrusion from the source bus line SL.

Such an active matrix substrate 1000 is applicable to a display device of the FFS mode, for example. The FFS mode is a mode under the lateral field method, where a pair of electrodes (a pixel electrode PE and the common electrode CE) are provided on one of the substrates and an electric field is applied to liquid crystal molecules in a direction (lateral direction) that is parallel to the substrate plane.

An active matrix substrate according to the present embodiment may be applied to a display device of a vertical field driving method, such as the VA mode. In that case, the common electrode CE is to be formed on a counter substrate which is opposed to the active matrix substrate via the liquid crystal layer.

<Connecting Portion Formation Region CR>

Figure 3A:
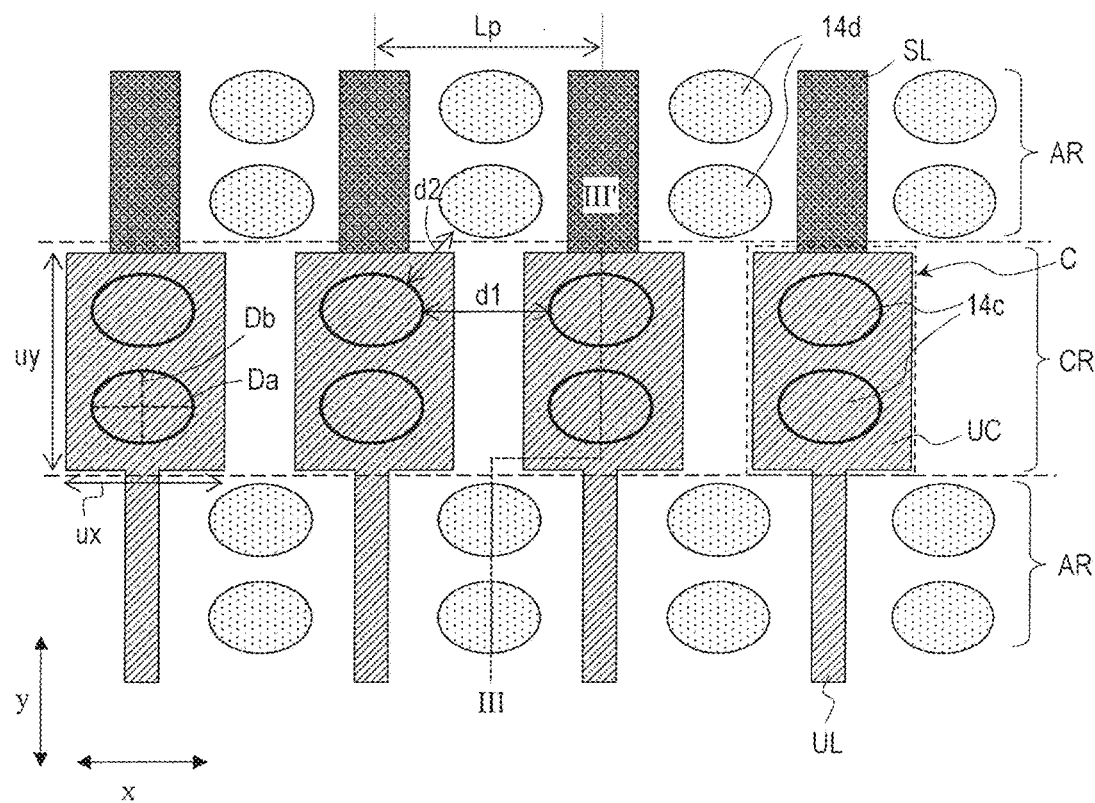
FIG. 3A is a plan view showing a connecting portion formation region CR and an adjoining region AR thereof according to the first embodiment.
Figure 3B:
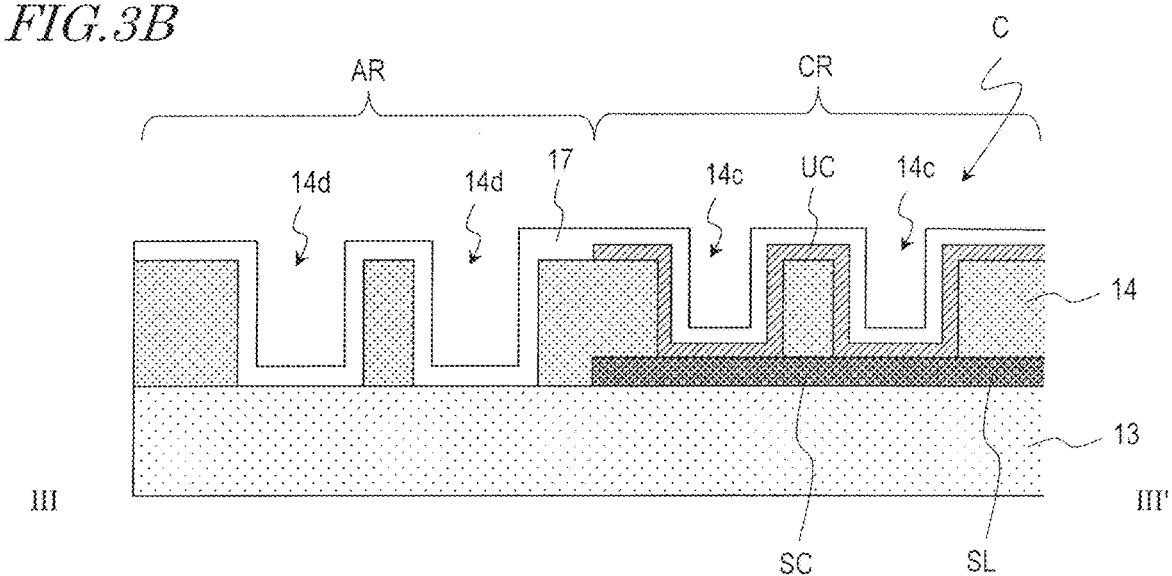
FIG. 3B is a cross-sectional view taken along line III-III'.

FIGS. 3A and 3B are a plan view of the connecting portion formation region CR and an adjoining region AR thereof, and a cross-sectional view taken along line III-III', respectively. The connecting portion formation region CR is disposed in the peripheral region FR.

The connecting portion formation region CR is a region where a plurality of source line connecting portions C are arranged. In the present embodiment, a plurality of dummy apertures 14d are provided in the region (adjoining region) AR that adjoins the connecting portion formation region CR. The plurality of dummy apertures 14d are disposed around the connecting portion formation region CR (defined by the plurality of source line connecting portions C), for example.

Each of the plurality of source line connecting portions C is a connecting portion that connects a source bus line SL and an upper wiring line UL, for example. The source line connecting portion C includes a source connecting portion SC that is formed in the source metal layer, an organic insulating layer 14 disposed on the source connecting portion SC, and an upper connecting portion UC. The upper connecting portion UC may be formed in the third metal layer, for example. The organic insulating layer 14 has at least one (e.g., two herein) aperture(s) 14c through which the source connecting portion SC is partially exposed. The upper connecting portion UC is disposed on the organic insulating layer 14 and in the aperture 14c, so as to be directly in contact with the source connecting portion SC within the aperture 14c. A dielectric layer 17 may extend on the upper connecting portion UC and the organic insulating layer 14. The source connecting portion SC may be a portion (end) of the source bus line SL, and the upper connecting portion UC may be a portion (end) of the upper wiring line UL. When viewed from the normal direction of the substrate 1, each source connecting portion SC may be disposed so as to overlap two apertures 14c, in a size which is equal to or different from that of the upper connecting portion UC. The upper wiring line UL may be connected to a source driver via a source terminal portion.

The upper connecting portion UC may be made of the same metal film as the metal line 21. Alternatively, in the case where the metal line 21 is not provided, the upper connecting portion UC may be made of the same metal film as driving lines of the touch screen panel, for example.

In the present embodiment, the plurality of dummy apertures 14d are provided in the region (adjoining region) AR that adjoins the connecting portion formation region CR.

Each of the plurality of dummy apertures 14d is provided in a region around the plurality of source line connecting portions C, where none of the source connecting portion SC, the source bus line SL, the upper connecting portion UC, and the upper wiring line UL exists. The dummy apertures 14d are made in the organic insulating layer 14, and partially exposes an insulating layer 13 which is an underlying layer of the source metal layer. The upper connecting portion UC is not provided within the dummy apertures 14d. That is, the structure including the dummy apertures 14d (dummy structure) may be similar to the structure of the source line connecting portion C except that the dummy structure lacks the source connecting portion SC and the upper connecting portion UC. On the insulating layer 13 and the organic insulating layer 14, the dielectric layer 17 extends. The dielectric layer 17 may be in contact with the insulating layer 13 within the dummy apertures 14d.

The plurality of dummy apertures 14d may be provided on the display region side of the plurality of source line connecting portions C and/or the opposite side therefrom. The plurality of dummy apertures 14d may be disposed both on the display region side of the connecting portion formation region CR and on the opposite side therefrom, in a manner of sandwiching the connecting portion formation region CR. For example, the plurality of dummy apertures 14d may be disposed so as to surround the connecting portion formation region CR when viewed from the normal direction of the substrate 1. There is no particular limitation as to the exact positions of the dummy apertures 14d. As shown in the figure, the dummy apertures 14d may be disposed in every interspace between two adjacent source bus lines SL and/or every interspace between two adjacent upper wiring lines UL. As a result, a predetermined number of dummy apertures 14d can be formed without increasing the area of the peripheral region FR.

As described above, the present inventors have found that, when a plurality of apertures are arranged in the organic insulating layer, film detachment is unlikely to occur in each portion of the organic insulating layer that is surrounded by (or interposed between) apertures. This is presumably because, in a portion surrounded by a plurality of apertures, the stress associated with contraction of the organic insulating layer is dispersed or relaxed by the apertures. In the present embodiment, by providing the dummy apertures 14d adjacent to the connecting portion formation region CR, stress in the organic insulating layer 14 is relaxed within the connecting portion formation region CR, whereby film detachment of the organic insulating layer 14 is restrained from occurring at the edge of each aperture 14c. In particular, film detachment at the edge of each aperture 14c can be more effectively suppressed when an aperture 14c in the source line connecting portion C is interposed between (or surrounded by) a plurality of dummy apertures 14d.

Figure 4:
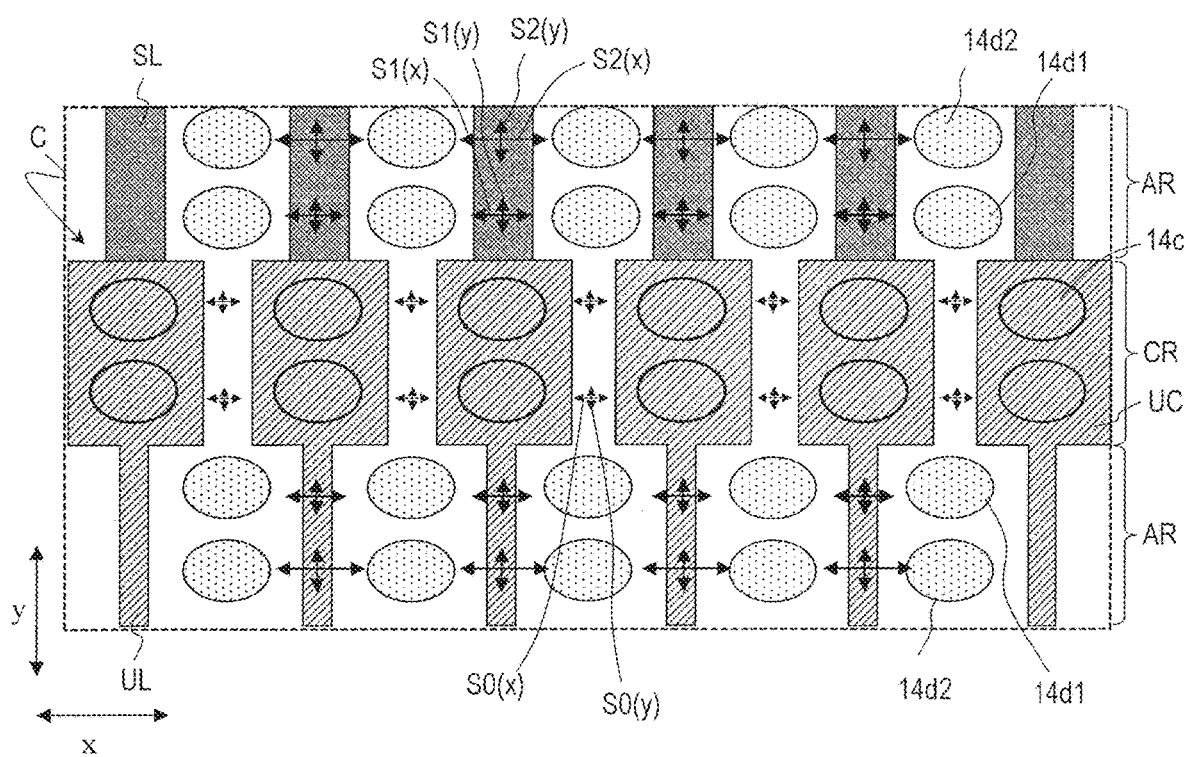
FIG. 4 is a schematic diagram illustrating an example of stresses emerging along the x direction and the y direction in the organic insulating layer 14 at the connecting portion formation region CR and the adjoining region AR thereof.

FIG. 4 is a schematic diagram illustrating an example of stresses emerging along the x direction and the y direction in the organic insulating layer 14 at the connecting portion formation region CR and the adjoining region AR thereof. In this example, a plurality of first dummy apertures 14d1 are arranged around the connecting portion formation region CR, and a plurality of second dummy apertures 14d2 are arranged further outside of the first dummy apertures 14d1. In other words, the second dummy apertures 14d2 are located at the outermost periphery of the entire region where the plurality of apertures 14c and the plurality of dummy apertures 14d are provided (hereinafter referred to as the "aperture formation region"), with the apertures 14c in the connecting portion formation region CR being located towards the inside (the central portion) of the aperture formation region. Let the stresses emerging along the first direction y (the y direction) and the second direction x (the x direction) in any portion of the organic insulating layer 14 that is located between second dummy apertures 14d2 at the outermost periphery be S2(y) and S2(x); let the stresses emerging along the y direction and the x direction in any portion that is located between first dummy apertures 14d1 be S1(y) and S1(x); and let the stresses emerging along the x direction and the y direction in any portion that is located between the apertures 14c in adjoining source line connecting portions C be S0(x) and S0(y). Then, S2(y)>S1(y)>S0(y) and S2(x)>S1(x)>S0(x) hold. Therefore, at the edge of any second dummy aperture 14d2 at the outermost periphery of the aperture formation region, a greater tension acts on the interface with the source connecting portion SC, so that film detachment is more likely there. On the other hand, the more inside of the aperture formation region an aperture is located, the more relaxed is the tension acting on its edge, so that film detachment is less likely there. Particularly in the connecting portion formation region CR, stresses are dispersed or relaxed by two rows of dummy apertures 14d1 and 14d2, so that film detachment at the edge of each aperture 14c is suppressed.

Although the example shown here illustrates that the dummy apertures 14d constitute two rows in the adjoining region AR, there may alternatively be one row, or three or more rows. However, film detachment at the apertures 14c can be more effectively relaxed when the connecting portion formation region CR is surrounded by two or more rows.

Moreover, the dummy apertures 14d may be provided only on the display region side of the connecting portion formation region CR (or only on the opposite side therefrom). In this case, too, film detachment is suppressed at the edge of the aperture 14c on the display region side (or on the opposite side therefrom), and thus effects of suppressing connection insufficiencies due to film detachment are obtained accordingly.

There is no particular limitation as to the size, number, array pitch, etc., of apertures 14c and dummy apertures 14d in the present embodiment. Without being limited to an elliptical shape, the apertures 14c and 14d may have any other shape, e.g., a circle. The area of a dummy aperture 14d may be not less than 1/4 times and not more than 4 times the area of an aperture 14c. As one example, in the case of a circular aperture 14c, its diameter may be not less than 3 µm and not more than 30 µm. In the case of an elliptic aperture 14c, its major axis may be not less than 5 µm and not more than 50 µm and its minor axis may be not less than 3 µm and not more than 30 µm. A dummy aperture 14d may be identical in shape to an aperture 14c. A dummy aperture 14d may have substantially the same size as an aperture 14c. The number of dummy apertures 14d may be 1/2 times or more, preferably 1 time or more, or 2 times or more, of the number of source line connecting portions C. Although there is no particular limitation as to the positions of the dummy apertures 14d, for example, the distance d2 between each source line connecting portion C and a dummy aperture 14d that is the closest to that source line connecting portion C may be not less than 1/2 times the distance d1 between adjoining source line connecting portions C and not more than 2 times the distance d1, for example. In order to prevent stresses from concentrating on only some apertures 14c or only some dummy apertures 14d, the dummy apertures 14d may be arranged around the connecting portion formation region CR with a constant pitch. The array pitch of the dummy apertures 14d may be about the same as the array pitch of the source bus lines SL.

There is no particular limitation as to the sizes of the upper connecting portion UC and the source connecting portion SC, either. For example, the width ux of the upper connecting portion UC and the source connecting portion SC along the x direction may be not less than 6 µm and not more than 60 µm, and their width uy along the y direction may be not less than 6 µm and not more than 60 µm.

Figure 5A:
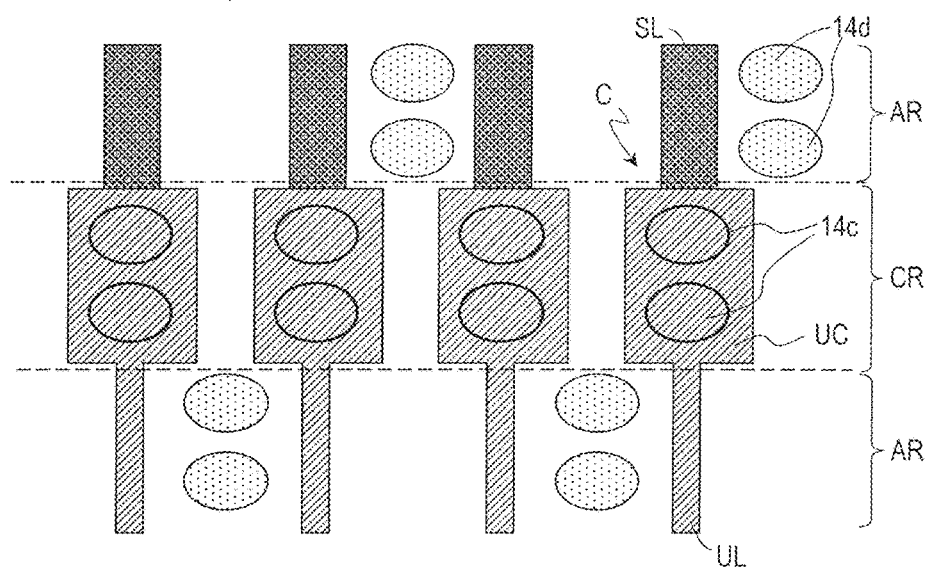
FIG. 5A is a plan view showing a variation of an arrangement of dummy apertures 14d according to the first embodiment.
Figure 5B:
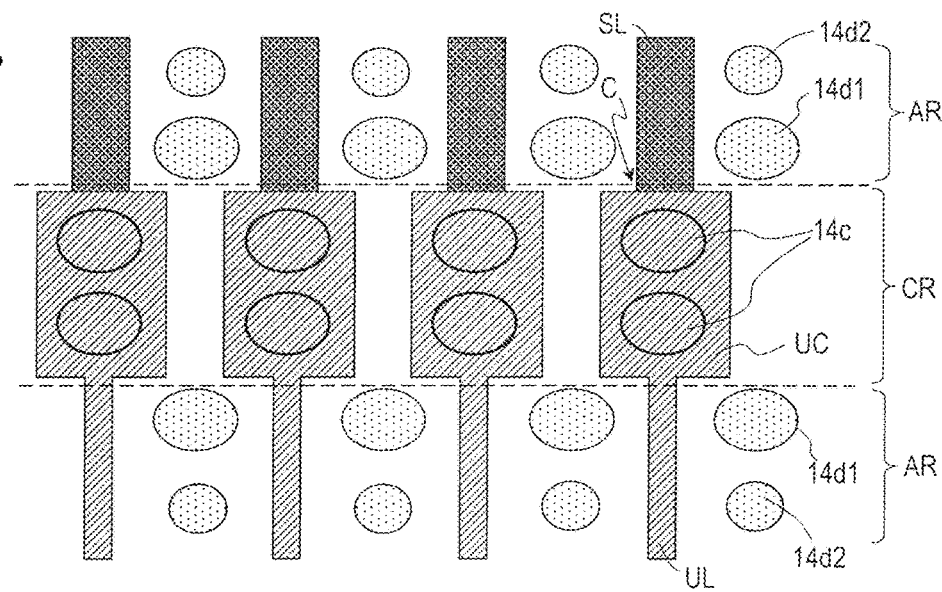
FIG. 5B is a plan view showing a variation of an arrangement of dummy apertures 14d according to the first embodiment.

FIGS. 5A and 5B are each a plan view showing a variation of an arrangement of dummy apertures 14d according to the present embodiment.

As shown in FIG. 5A, dummy apertures 14d may be provided in every other interspace between source bus lines SL. In this example, the number of dummy apertures 14d is equal to the number of source line connecting portions C.

As shown in FIG. 5B, the size of each second dummy aperture 14d2 may be smaller than the size of the first dummy aperture 14d1 (that is provided between the second dummy apertures 14d2 and the connecting portion formation region CR). Moreover, the second dummy apertures 14d2 may be circular, while the first dummy apertures 14d1 may be elliptic. With such construction, film detachment of the dummy apertures 14d1 and 14d2 can also be reduced.

FIGS. 1 through 3B have illustrated the active matrix substrate 1000 for use in a display device of the FFS mode, an active matrix substrate according to the present embodiment is also applicable to a display device of a vertical field driving method such as the VA mode.

Figure 5C:
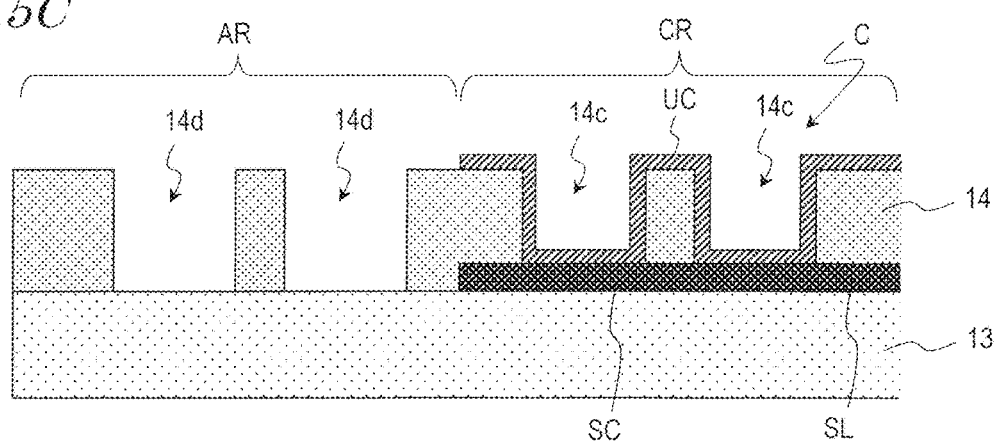
FIG. 5C is a cross-sectional view showing another example of a source line connecting portion C and dummy apertures 14d according to the first embodiment.

FIG. 5C is a cross-sectional view of a connecting portion formation region CR and an adjoining region AR in an active matrix substrate for use in a display device of the VA mode. The plan view thereof, which is identical to FIG. 3A, is omitted.

In a display device of the VA mode, the common electrode CE is to be provided on the counter substrate side, and therefore the active matrix substrate lacks the dielectric layer 17, the common electrode CE, and the metal line 21. Thus, as shown in the figure, the insulating layer 13 and the upper connecting portion UC are not covered by any dielectric layer 17. Otherwise its construction is similar to that shown in FIG. 3B.

Second Embodiment

Hereinafter, with reference to the drawings, an active matrix substrate according to a second embodiment will be described. Each source line connecting portion C of the active matrix substrate according to the present embodiment differs from each source line connecting portion C (FIGS. 3A and 3B) of the previously-described embodiment with respect to the shape of the aperture 14c. The pixel structure may be similar to the pixel structure (FIG. 2) in the previously-described embodiment.

Figure 6:
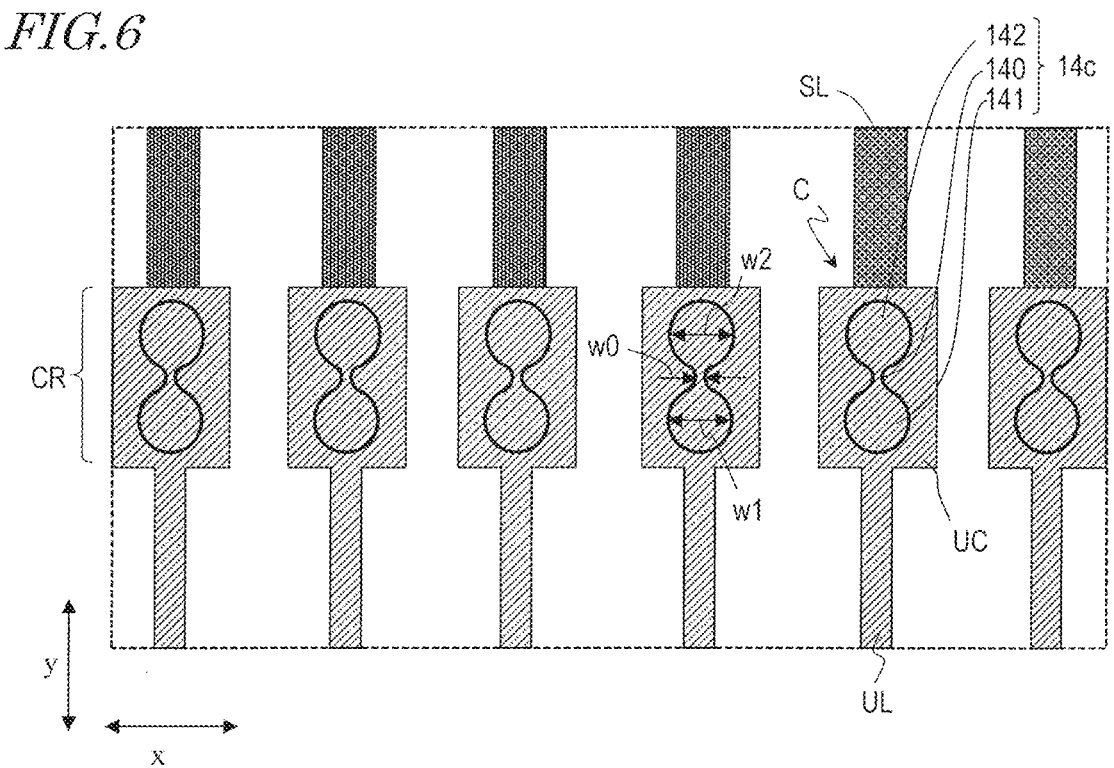
FIG. 6 is a plan view showing a part of a connecting portion formation region CR according to a second embodiment.

FIG. 6 is a plan view showing a part of a connecting portion formation region CR according to the second embodiment. Its cross-sectional view would be similar to the cross-sectional view of the connecting portion formation region CR shown in FIG. 3B.

In the present embodiment, when viewed from the normal direction of the substrate 1, each aperture 14c in the source line connecting portion C includes: a first aperture subregion 141; a second aperture subregion 142; and a third aperture subregion 140 that is located between the aperture subregions 141 and 142 and connects between the first aperture subregion 141 and the second aperture subregion 142. The width w0 of the third aperture subregion 140 is smaller than the width w1 of the first aperture subregion 141 and smaller than the width w2 of the second aperture subregion 142. The width w1 and the width w2 may be equal. As used herein, "the width of an aperture subregion" refers to the width (maximum width) along a direction (e.g., herein the second direction x) which is orthogonal to the direction (e.g., herein the first direction y) that the third aperture subregion 140 extends between the first aperture subregion 141 and the second aperture subregion 142. Therefore, when viewed from the normal direction of the substrate 1, the third aperture subregion 140 defines a constricted portion of the aperture 14c. Hereinafter, the third aperture subregion 140 will be referred to as the "constriction".

The planar shape of the aperture 14c may be such that the elliptic or circular first aperture subregion 141 and second aperture subregion 142 are connected via the constriction 140, for example.

At least a portion of the side face of the aperture 14c may be a curved surface (i.e., at least a portion of the peripheral edge (contour) of the aperture 14c may present a curve when viewed from the normal direction of the substrate 1). The entire side face of the aperture 14c may consist of a curved surface(s). In particular, it is preferable that the constriction 140 is composed of a concaved curved surface(s) (concave surface(s)) (i.e., when viewed from the normal direction of the substrate 1, the peripheral edge of the constriction 140 presents a curve(s)).

Figure 7A:
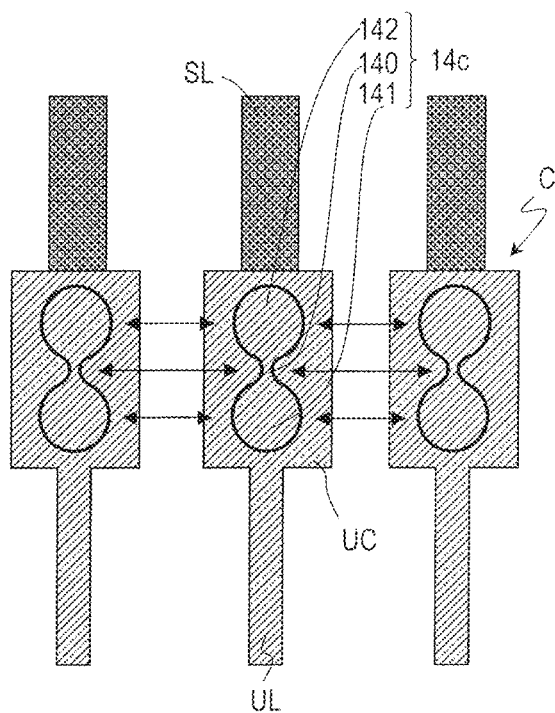
FIG. 7A is a schematic diagram illustrating an example of stresses emerging in the organic insulating layer 14 at the connecting portion formation region CR.
Figure 7B:
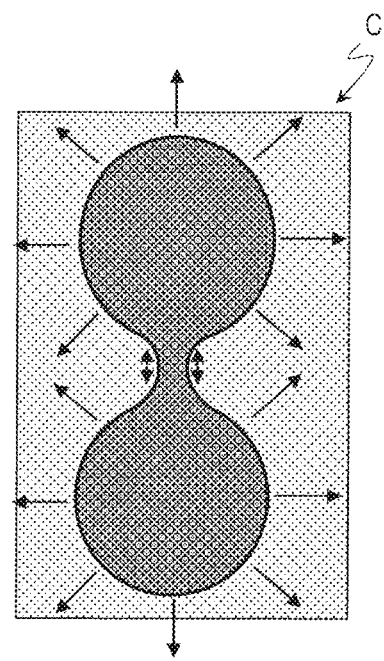
FIG. 7B is a schematic diagram illustrating an example of stresses emerging in the organic insulating layer 14 at the connecting portion formation region CR.

FIGS. 7A and 7B are schematic diagrams illustrating examples of stresses emerging in the organic insulating layer 14 at the connecting portion formation region CR.

As indicated by arrows in FIG. 7A, when the constriction 140 is provided in each aperture 14c, the distance between two apertures 14c varies in accordance with the shape of each aperture 14c, being largest between the constrictions 140. Therefore, stresses emerging along the x direction in the organic insulating layer 14 will become greater between the constrictions 140 of two apertures 14c than between the first aperture subregion 141 and the second aperture subregion 142, for example. Moreover, as shown in FIG. 7B, near the edges of the first aperture subregion 141 and the second aperture subregion 142, stresses will act on the organic insulating layer 14 in radial directions. In portions of the organic insulating layer 14 that are near the constriction 140, stresses emerging along the y direction will be counteracted and become reduced.

Thus, by forming apertures 14c each including aperture subregions of different sizes, stresses in the organic insulating layer 14 between adjacent apertures 14c can be dispersed. This allows film detachment to be suppressed along the entire edge of each aperture 14c. So long as film detachment does not occur in at least a portion of the edge of each aperture 14c (e.g., at the edge of the constriction 140 of each aperture 14c), some effect of suppressing connection insufficiencies or other problems associated with film detachment can be obtained.

The width w0 of the constriction 140 may be e.g. not less than 25% and not more than 75% of the width w1 of the first aperture subregion 141 and of the width w2 of the second aperture subregion 142. Moreover, the constriction 140 may be composed of a concave surface; this will allow stress to be further dispersed and relaxed, whereby film detachment at the constriction 140 can be more effectively suppressed.

Figure 8:
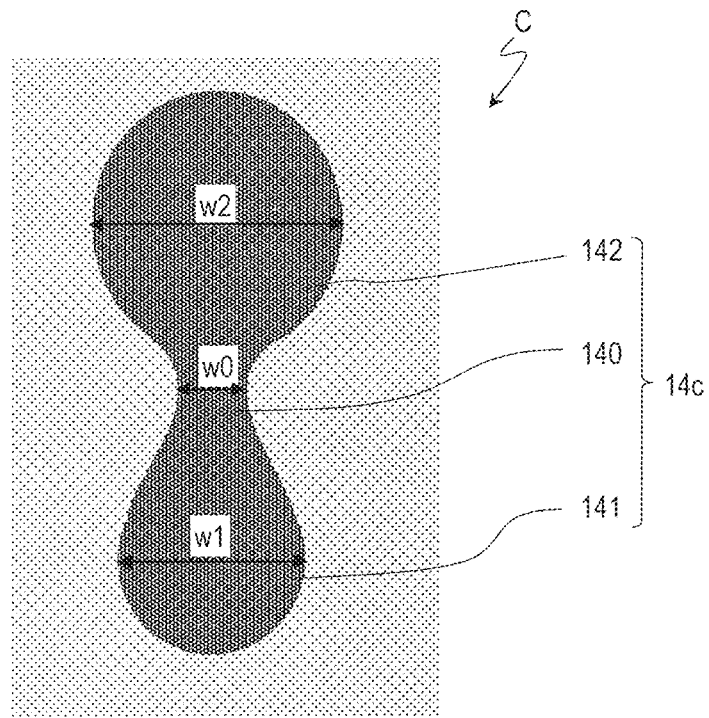
FIG. 8 is a plan view showing another example of a source line connecting portion C according to the second embodiment.

The first aperture subregion 141 and the second aperture subregion 142 may be identical or different in size, shape, etc. For example, as shown in FIG. 8, the width w1 of the first aperture subregion 141 may be smaller than the width w2 of the first aperture subregion 142. By differentiating the width w1 of the first aperture subregion 141 and the width w2 (or the diameter in the case of a circular shape) of the second aperture subregion 142, stress between apertures 14c can be more effectively dispersed, whereby film detachment can be further suppressed.

Although not shown, dummy apertures as described in the previously-described embodiment may also be provided in a region that adjoins the connecting portion formation region CR in the present embodiment.

Third Embodiment

Hereinafter, with reference to the drawings, an active matrix substrate according to a third embodiment will be described. Source line connecting portions C of the active matrix substrate according to the present embodiment differ from the source line connecting portions C (FIGS. 3A and 3B) in the previously-described embodiment in that apertures 14c are arranged in a staggered manner. The pixel structure may be similar to the pixel structure (FIG. 2) in the previously-described embodiment.

Figure 9:
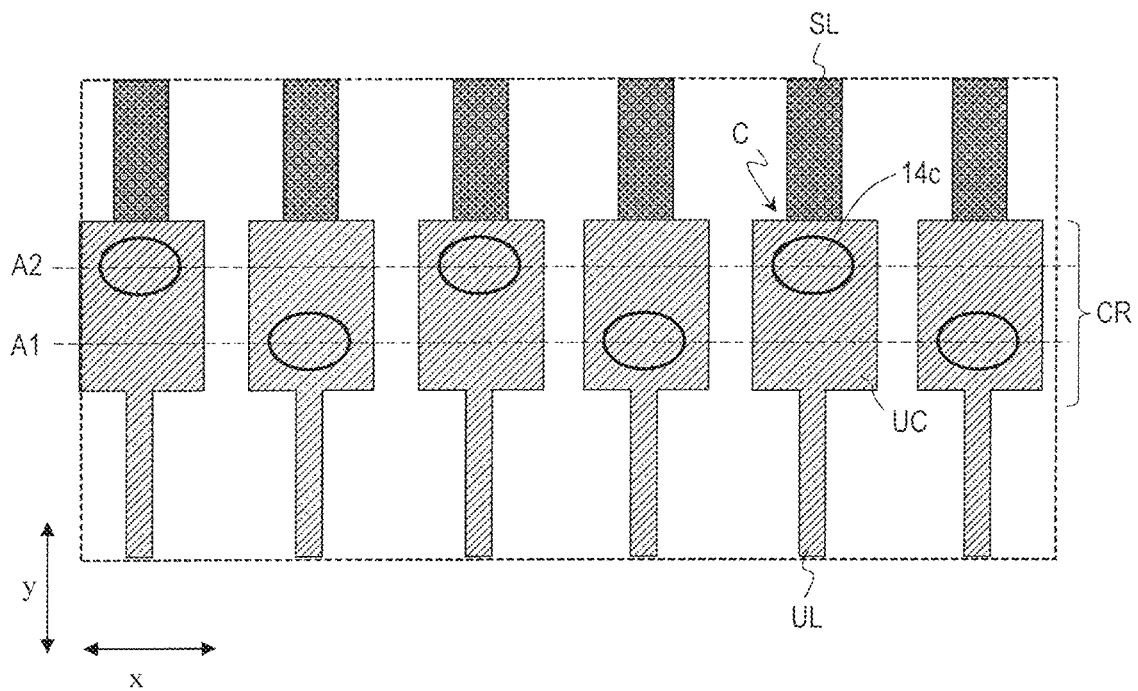
FIG. 9 is a plan view showing a part of a connecting portion formation region CR according to a third embodiment.

FIG. 9 is a plan view showing a part of a connecting portion formation region CR according to the third embodiment. Its cross-sectional view would be similar to the cross-sectional view of the connecting portion formation region CR shown in FIG. 3B.

In the present embodiment, the apertures 14c in the plurality of source line connecting portions C are arranged in a staggered manner. In this example, each source line connecting portion C(N) has one aperture 14c, for example. The aperture 14c in a given source line connecting portion C and the aperture 14c in a source line connecting portion C which is adjacent to that source line connecting portion C are offset from each other along the y direction. As shown in the figure, those source line connecting portions C which have their apertures 14c aligned on a line A1 that extends along the x direction and those source line connecting portions C which have their apertures 14c aligned on a line A2 (extending along the x direction) that is closer to the display region than is the line A1 may be alternately arranged. This allows the interspace between the apertures 14c in two adjacent source line connecting portions C to be greater than an array pitch of the source line connecting portions C (e.g., the array pitch between the source bus lines SL).

Figure 10:
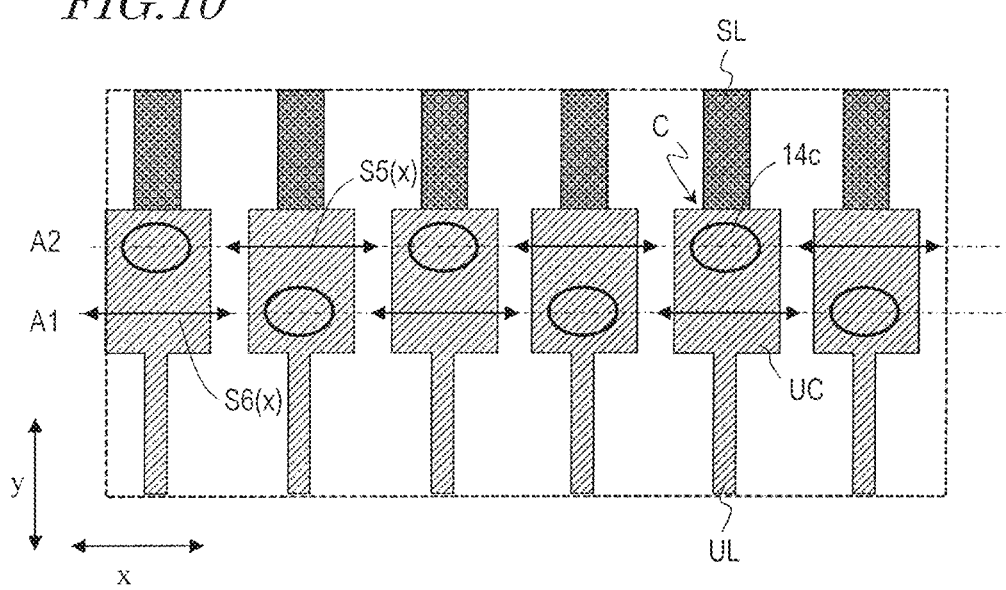
FIG. 10 is a schematic diagram illustrating an example of stresses emerging (along the x direction) in the organic insulating layer 14 at the connecting portion formation region CR.

FIG. 10 is a schematic diagram illustrating an example of stresses emerging (along the x direction) in the organic insulating layer 14 at the connecting portion formation region CR.

According to the present embodiment, as illustrated in FIG. 10, a stress S5(x) emerging (along the x direction) in the organic insulating layer 14 between apertures 14c that are aligned on the line A1 and a stress S6(*x*) emerging (along the x direction) in the organic insulating layer 14 between apertures 14*c* aligned on the line A1 counteract each other. This reduces the tension acting on the interface between the edge of each aperture 14*c* and each source connecting portion SC, whereby film detachment of the organic insulating layer 14 can be suppressed.

Figure 11A:
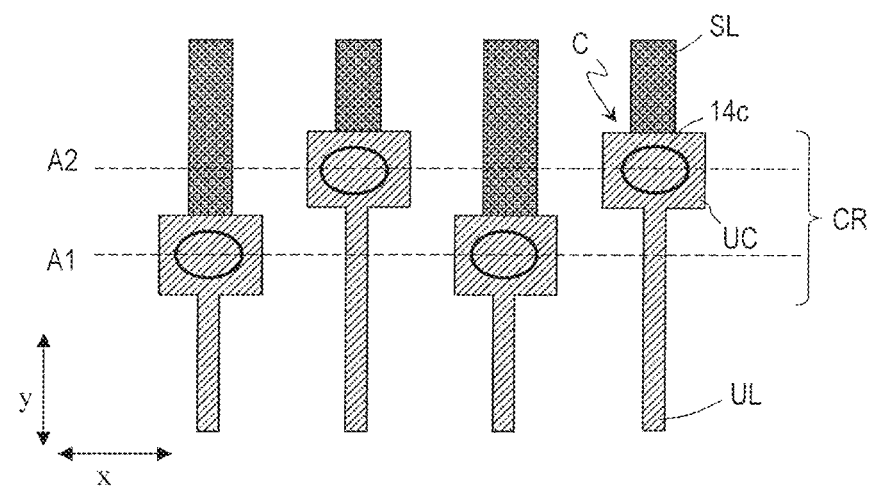
FIGS. 11A through 11C are diagrams showing other examples of source line connecting portions C according to the third embodiment.
Figure 11B:
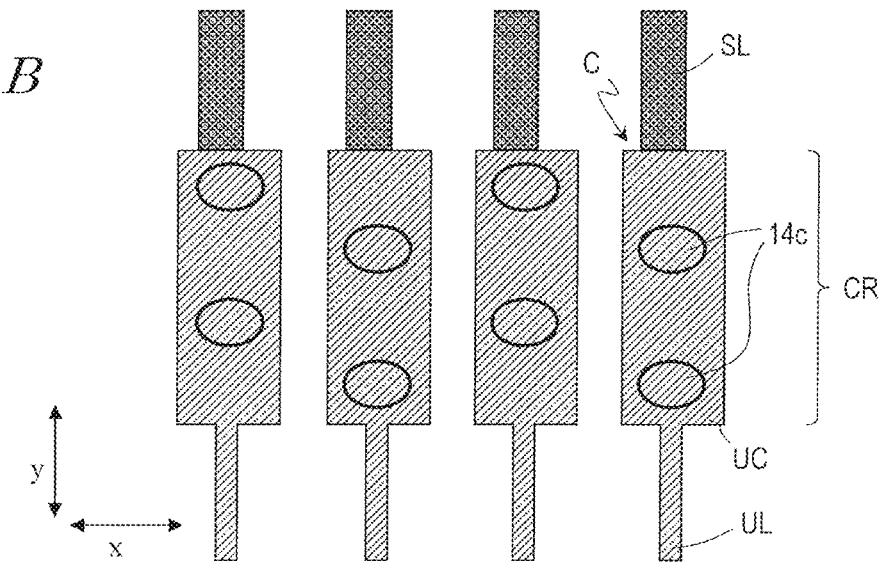
Figure 11C:
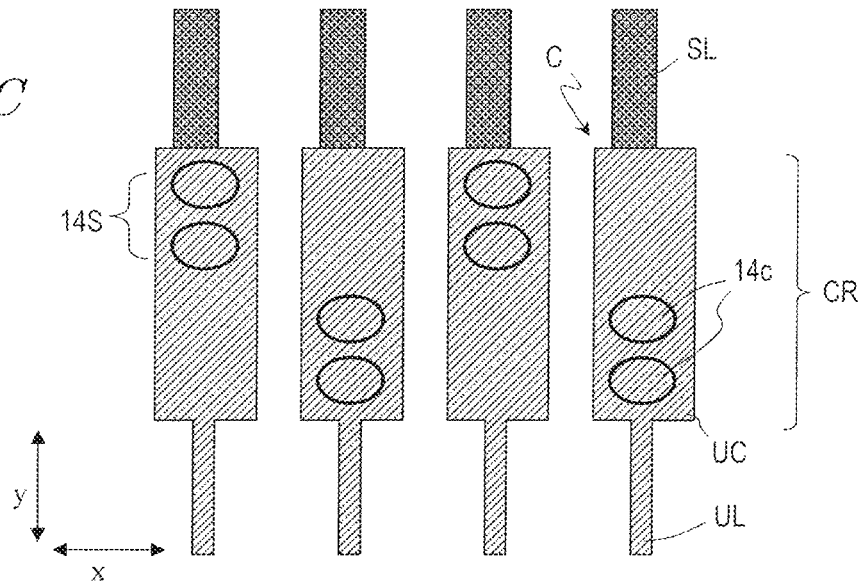

FIGS. 11A through 11C are diagrams showing other examples of source line connecting portions C according to the third embodiment.

As shown in FIG. 11A, in the connecting portion formation region CR, the upper connecting portion UC and the source connecting portion SC may themselves be arranged in a staggered manner. In other words, the upper connecting portion UC and the source connecting portion SC in adjacent source line connecting portions C may be offset along the y direction based on the positions of the respective apertures 14*c*.

As is illustrated in FIG. 11B, each of the plurality of source line connecting portions C may have a plurality of (e.g., two herein) apertures 14*c*. In this case, too, the apertures 14*c* may be arranged in a staggered manner. Alternatively, as is illustrated in FIG. 11C, aperture sets 14S, each consisting of a plurality of (e.g., two herein) apertures 14*c*, in the respective source line connecting portions C may be arranged in a staggered manner.

Although not shown, also in the present embodiment, dummy apertures as described in the first embodiment may also be provided in a region that adjoins the connecting portion formation region CR. Each aperture 14*c* may have the constriction as described in the second embodiment.

<Method of Producing the Active Matrix Substrate>

Next, an exemplary method of producing the active matrix substrates according to the first to third embodiments will be described. Although a method of producing an active matrix substrate as illustrated in FIG. 2 and FIGS. 3A and 3B will be described as an example, the active matrix substrates according to the other embodiments can also be produced by a similar method.

First, an underlying film 11 is formed on a substrate 1. Various substrates may be used as the substrate 1, e.g., a glass substrate, a resin plate, or a resin film. Although there is no particular limitation, the underlying film 11 may be a silicon nitride (SiNx) film, a silicon oxide (SiOx) film, or a multilayer film thereof, for example.

Thereafter, a crystalline silicon semiconductor layer 7 is formed on the underlying film 11. Specifically, first, an amorphous silicon (a-Si) film is formed on the underlying film 11. Formation of the a-Si film may be performed by a known method such as plasma CVD (Chemical Vapor Deposition) or sputtering, for example. Next, the a-Si film is crystallized by a known method such as laser annealing, thereby providing a crystalline silicon film. Then, the crystalline silicon film is patterned to form the crystalline silicon semiconductor layer 7 (thickness: e.g. not less than 30 nm and not more than 70 nm) in island shapes.

Next, a gate insulating layer 5 is formed so as to cover the crystalline silicon semiconductor layer 7. The gate insulating layer 5 may be an inorganic insulating layer such as a silicon oxide layer (thickness: e.g. not less than 50 nm and not more than 200 nm), for example.

Then, by using e.g. a sputtering technique, a first electrically conductive film (thickness: e.g. not less than 50 nm and not more than 500 nm) is formed on the gate insulating layer 5 and then patterned, thereby providing a gate metal layer including gate electrodes GE and gate bus lines GL. There is no particular limitation as to the material of the first electrically conductive film, and a film containing any metal such as aluminum (Al), tungsten (W), molybdenum (Mo), tantalum (Ta), chromium (Cr), titanium (Ti), copper (Cu) or an alloy thereof may be used as appropriate. A multilayer film obtained by stacking a plurality of such films may also be used. There is no particular limitation as to the patterning method, and known photolithography and dry etching techniques may be used.

Thereafter, by using each gate electrode GE as a mask, an impurity is implanted into the crystalline silicon semiconductor layer 7, thereby forming a source region 7*s* and a drain region 7*d*. The region of the crystalline silicon semiconductor layer 7 in which the impurity was not implanted becomes an active region (channel region) 7*c*.

Then, an insulating layer 13 (thickness: e.g. not less than 180 nm and not more than 550 nm) covering the gate insulating layer 5 and the gate electrodes GE is formed. Herein, the insulating layer 13 is an inorganic insulating layer, e.g., a silicon nitride (SiNx) layer, a silicon oxide (SiOx) layer, or a multilayer film thereof. The insulating layer 13 may be formed by CVD technique, for example.

Next, apertures 13*s* and 13*d* that reach each source region 7*s* and each drain region 7*d* of the crystalline silicon semiconductor layer 7 are formed in the insulating layer 13 and the gate insulating layer 5.

Thereafter, by using e.g. a sputtering technique, a second electrically conductive film (thickness: e.g. not less than 50 nm and not more than 500 nm) is formed on the insulating layer 13 and in the apertures 13*s* and 13*d* and patterned, thereby providing a source metal layer that includes source electrodes SE, source bus lines SL, source connecting portions SC, and source bus lines SL. There is no particular limitation as to the material of the second electrically conductive film, and a film containing any metal such as aluminum (Al), tungsten (W), molybdenum (Mo), tantalum (Ta), copper (Cu), chromium (Cr), or titanium (Ti), or an alloy thereof, or a metal nitride thereof, may be used as appropriate. A multilayer film obtained by stacking a plurality of such films may also be used. Thus, the TFTs 10 are produced.

Then, an organic insulating layer 14 (thickness: e.g. not less than 2 μm and not more than 5 μm) is formed so as to cover the TFTs 10. The organic insulating layer 14 is disposed so as to be in contact with an upper face of the source connecting portion SC. The organic insulating layer 14 is formed via application, for example. The organic insulating layer 14 may be a layer of acrylic transparent resin having a positive type photosensitivity, for example.

Thereafter, an aperture 14*p* through which to partially expose the drain electrode DE of the TFT 10 in each pixel region P is formed in the organic insulating layer 14, and also an aperture 14*c* through which to partially expose the source connecting portion SC is formed in the connecting portion formation region CR. At this time, dummy apertures 14*d* may be formed around the connecting portion formation region CR. The dummy apertures 14*d* are disposed so as not to overlap the source connecting portions SC when viewed from the normal direction of the substrate 1.

Next, on the organic insulating layer 14, a first transparent electrically conductive film (thickness: e.g. 20 to 300 nm) is formed and then patterned, thereby forming a common electrode CE. The first transparent electrically conductive film may be an ITO (indium tin oxide) film, an IZO film, a ZnO film (zinc oxide), or the like.

Then, a third electrically conductive film (thickness: e.g. 50 nm to 300 nm) is formed so as to cover the organic insulating layer 14 and the common electrode CE and then is patterned, thereby providing a third metal layer including a metal line 21, upper connecting portions UC, and upper wiring lines UL. As the material of the third electrically conductive film, the same material as the second electrically conductive film may be used, for example.

Thereafter, a dielectric layer 17 (thickness: e.g. not less than 50 nm and not more than 200 nm) is formed and then patterned to make apertures 17$p$ in the dielectric layer 17. As the dielectric layer 17, for example, a silicon oxide (SiOx) film, a silicon nitride (SiNx) film, a silicon oxide nitride (SiOxNy; x>y) film, a silicon nitride oxide (SiNxOy; x>y) film, or the like may be used as appropriate. The apertures 17$p$ are disposed so as to at least partially overlap the apertures 14$p$ when viewed from the normal direction of the substrate 1. In this example, each aperture 17$p$ is disposed inside the aperture 14$p$. As a result, a pixel contact hole that partially exposes the drain electrode DE is obtained.

Then, on the dielectric layer 17, a second transparent electrically conductive film (thickness: e.g. 20 to 300 nm) is formed and then patterned, thereby forming pixel electrodes PE. Each pixel electrode PE is in contact with the drain electrode DE within the pixel contact hole. The second transparent electrically conductive film may be an ITO film, an IZO film, a ZnO film, or the like. A slit-like opening is made in the pixel electrode PE. In this manner, an active matrix substrate according to any of the above embodiments is obtained.

Active matrix substrates according to the first to third embodiments are also applicable to a liquid crystal display device of an in-cell touch screen panel type that performs display in the FFS mode, the IPS mode, or the like. In this case, the common electrode CE may also function as a detection electrode for a haptic sensor (hereinafter referred to as a common/detection electrode"). The common/detection electrode is divided into a plurality of portions (detection regions) by slits or the like. The respective detection regions may be disposed so as to correspond to the plurality of pixel electrodes PE, for example. In this construction, a metal line 21 that is formed in the third metal layer is electrically connected to each detection region, and may function as a wiring line (also referred to as driving lines) for driving the haptic sensor.

Alternatively, the active matrix substrate 1000 is also applicable to a liquid crystal display device of an in-cell touch screen panel type that performs display in the VA mode. In this case, the common electrode is provided on the counter substrate side. In the first transparent electrically conductive layer, a detection electrode including a plurality of detection regions is formed. The metal line 21 may be a driving line that is connected to each detection region.

The construction, driving method, etc., of a display device of an in-cell touch screen panel type are disclosed in International Publication No. 2015/059995 filed by the Applicant of the present application, for example. The entire disclosure of International Publication No. 2015/059995 is incorporated herein by reference.

Although a connecting portion between a source bus line and an upper wiring line is exemplified as a line connecting portion in the above embodiments, the line connecting portion is not limited to such examples. The line connecting portion may at least be constructed so that a lower connecting portion which is formed in a lower wiring line layer (e.g., a source metal layer) and an upper connecting portion that is disposed on the lower connecting portion via an organic insulating layer are connected via an aperture that is made in the organic insulating layer. The lower connecting portion may be electrically connected to a wiring line (lower wiring line) that is formed in the lower wiring line layer, while the upper connecting portion may be electrically connected to an upper wiring line. The line connecting portion may also be a terminal portion.

Although the above embodiments illustrate examples where crystalline silicon TFTs of a top-gate type are used as pixel TFTs, the pixel TFTs may be of a bottom-gate type. Moreover, the pixel TFTs may be silicon TFTs whose active layer is an amorphous silicon layer, a microcrystalline silicon layer, or the like. Alternatively, the pixel TFTs may be oxide semiconductor TFTs whose active layer is an oxide semiconductor layer such as an In—Ga—Zn—O-based semiconductor layer. The construction of the source line connecting portions according to the above embodiments is applicable to various active matrix substrates, irrespective of the material and structure of the pixel TFTs.

Embodiments of the present invention are broadly applicable to various devices that include an active matrix substrate, for example, devices that include thin film transistors: e.g., display devices such as liquid crystal display devices, organic electroluminescence (EL) display devices, and inorganic electroluminescences; display devices of in-cell touch screen panel types; imaging devices such as image sensor devices; image input devices; fingerprint reader devices; or other electronic devices.

This application is based on U.S. Provisional Patent Applications No. 62/712,268 filed on Jul. 31, 2018, the entire contents of which are hereby incorporated by reference.

What is claimed is:

1. An active matrix substrate comprising: a display region that includes a plurality of pixels; and a peripheral region that is disposed around the display region,
   the peripheral region including a connecting portion formation region in which a plurality of line connecting portions are arranged, wherein,
   each of the plurality of line connecting portions includes
      a lower connecting portion supported on a substrate,
      an organic insulating layer disposed on the lower connecting portion so as to be in contact with the lower connecting portion, the organic insulating layer having at least one aperture through which a part of the lower connecting portion is exposed, and
      an upper connecting portion disposed on the organic insulating layer and in the at least one aperture, the upper connecting portion being directly in contact with the part of the lower connecting portion within the at least one aperture;
   the organic insulating layer extends into an adjoining region that adjoins the connecting portion formation region;
   in the adjoining region, the organic insulating layer has a plurality of dummy apertures that are disposed so as not to overlap the lower connecting portions when viewed from a normal direction of the substrate, each of the plurality of dummy apertures exposing a part of an underlying layer that is located on the substrate side of the lower connecting portion; and
   the upper connecting portions are not provided in the plurality of dummy apertures.

2. The active matrix substrate of claim 1, wherein a subset of the plurality of dummy apertures is disposed on the display region side of the connecting portion formation region, and another subset of the plurality of dummy apertures is disposed on an opposite side of the connecting portion formation region from the display region.

3. The active matrix substrate of claim 1, wherein the plurality of dummy apertures are spaced apart from one another, so as to surround the connecting portion formation region.

4. The active matrix substrate of claim 1, further comprising an inorganic insulating layer that covers the organic insulating layer and the upper connecting portions in the connecting portion formation region and the adjoining region, wherein,
the inorganic insulating layer is directly in contact with the part of the underlying layer in each of the plurality of dummy apertures.

5. The active matrix substrate of claim 1, wherein,
when viewed from the normal direction of the substrate, the at least one aperture in the organic insulating layer of each of the plurality of line connecting portions includes a first aperture subregion and a second aperture subregion, and a third aperture subregion connecting between the first aperture subregion and the second aperture subregion, wherein a maximum width of the third aperture subregion taken along an orthogonal direction which is orthogonal to a direction that the third aperture subregion extends between the first aperture subregion and the second aperture subregion is smaller than a maximum width of the first aperture subregion and smaller than a maximum width of the second aperture subregion as taken along the orthogonal direction.

6. The active matrix substrate of claim 1, further comprising a plurality of lower wiring lines extending along a first direction and a plurality of upper wiring lines extending along the first direction, wherein,
the plurality of line connecting portions are arranged along a second direction which is orthogonal to the first direction;
each upper connecting portion is connected to a corresponding one of the plurality of upper wiring lines; and
each lower connecting portion is connected to a corresponding one of the plurality of lower wiring lines.

7. The active matrix substrate of claim 6, wherein,
the plurality of lower wiring lines are arranged along the second direction with interspaces existing between one another;
the plurality of upper wiring lines are arranged along the second direction with interspaces existing between one another; and
a subset of the plurality of dummy apertures is disposed in the interspaces between the plurality of lower wiring lines, and another subset of the plurality of dummy apertures is disposed in the interspaces between the plurality of upper wiring lines.

8. The active matrix substrate of claim 1, wherein, in the connecting portion formation region, the at least one aperture in the organic insulating layers of the plurality of line connecting portions are arranged in a staggered manner.

9. The active matrix substrate of claim 1, wherein, when viewed from the normal direction of the substrate, a peripheral edge of the at least one aperture in the organic insulating layer of each of the plurality of line connecting portions consists of a curve or curves.

10. The active matrix substrate of claim 1, further comprising a plurality of lower wiring lines extending along a first direction and a plurality of upper wiring lines extending along the first direction, wherein,
the plurality of line connecting portions are arranged, in a row or in a staggered manner, along a second direction which is orthogonal to the first direction;
each upper connecting portion is connected to a corresponding one of the plurality of upper wiring lines;
each lower connecting portion is connected to a corresponding one of the plurality of lower wiring lines; and
the at least one aperture in the organic insulating layer of each of the plurality of line connecting portions comprises a plurality of apertures that are arranged along the first direction.

11. The active matrix substrate of claim 1, further comprising a plurality of lower wiring lines extending along a first direction and a plurality of upper wiring lines extending along the first direction, wherein,
the plurality of line connecting portions are arranged, in a row or in a staggered manner, along a second direction which is orthogonal to the first direction;
each upper connecting portion is connected to a corresponding one of the plurality of upper wiring lines;
each lower connecting portion is connected to a corresponding one of the plurality of lower wiring lines;
the active matrix substrate further comprises a common electrode disposed in the display region, and an auxiliary metal line that is in contact with the common electrode;
the plurality of lower wiring lines are a plurality of source bus lines; and
the plurality of upper wiring lines and the upper connecting portions are made of a same metal film as the auxiliary metal line.

12. The active matrix substrate of claim 1, further comprising a plurality of lower wiring lines extending along a first direction and a plurality of upper wiring lines extending along the first direction, wherein,
the plurality of line connecting portions are arranged, in a row or in a staggered manner, along a second direction which is orthogonal to the first direction;
each upper connecting portion is connected to a corresponding one of the plurality of upper wiring lines;
each lower connecting portion is connected to a corresponding one of the plurality of lower wiring lines;
the active matrix substrate further comprises a driving line for driving an in-cell touch screen panel, the driving line being disposed in the display region;
the plurality of lower wiring lines are a plurality of source bus lines; and
the plurality of upper wiring lines and the upper connecting portions are made of a same metal film as the driving line.

* * * * *